(12) United States Patent
Grewell

(10) Patent No.: US 6,205,160 B1
(45) Date of Patent: Mar. 20, 2001

(54) LASER DIODE ARRAY

(75) Inventor: David A. Grewell, Waterbury, CT (US)

(73) Assignee: Branson Ultrasonics Corporation, Danbury, CT (US)

( * ) Notice: Subject to any disclaimer, the term of this patent is extended or adjusted under 35 U.S.C. 154(b) by 0 days.

(21) Appl. No.: 09/159,735

(22) Filed: Sep. 24, 1998

(51) Int. Cl.[7] .............................. H01S 3/04; H01S 3/091
(52) U.S. Cl. ................................................. 372/36; 372/75
(58) Field of Search ............................ 372/36, 50, 69, 372/70, 75

(56) References Cited

U.S. PATENT DOCUMENTS

| | | | |
|---|---|---|---|
| 3,962,655 | * 6/1976 | Selway et al. | 372/36 |
| 3,989,778 | 11/1976 | Osborne | 264/482 |
| 4,029,535 | 6/1977 | Cannon et al. | 156/272.8 |
| 4,158,762 | 6/1979 | Saunders | 219/121.6 |
| 4,224,096 | 9/1980 | Osborne | 156/380.9 |
| 4,237,363 | 12/1980 | Lemelson | 219/121.85 |
| 4,323,757 | 4/1982 | Oka et al. | 219/121.72 |
| 4,327,277 | 4/1982 | Daly | 219/121.64 |
| 4,419,304 | 12/1983 | Ficke et al. | 264/493 |
| 4,577,088 | 3/1986 | Sharp | 219/121.63 |
| 4,577,089 | 3/1986 | Olson | 219/124.22 |
| 4,603,089 | 7/1986 | Bampton | 428/593 |
| 4,636,609 | 1/1987 | Nakamata | 219/121.64 |
| 4,694,136 | 9/1987 | Kasner et al. | 219/121.64 |
| 4,694,137 | 9/1987 | Hawkins et al. | 219/121.63 |
| 4,697,061 | 9/1987 | Spater et al. | 219/121.64 |
| 4,700,044 | 10/1987 | Hokanson et al. | 219/121.63 |
| 4,716,568 | * 12/1987 | Scifres et al. | 372/36 |
| 4,733,039 | 3/1988 | Schnable et al. | 219/121.85 |
| 4,751,365 | 6/1988 | La Rocca et al. | 219/121.64 |
| 4,923,281 | 5/1990 | Krichever et al. | 359/826 |
| 5,049,720 | 9/1991 | Fang et al. | 219/121.63 |
| 5,066,846 | 11/1991 | Pirl | 219/121.63 |
| 5,107,091 | 4/1992 | Wagner et al. | 372/36 |
| 5,190,204 | 3/1993 | Jack et al. | 228/5.7 |
| 5,233,580 | 8/1993 | Tanaka et al. | 372/36 |
| 5,279,693 | 1/1994 | Robinson et al. | 156/272.8 |
| 5,286,327 | 2/1994 | Swartz | 156/273.3 |
| 5,300,356 | 4/1994 | Dempster et al. | 428/220 |
| 5,502,547 | 3/1996 | Shirai | 399/102 |
| 5,517,059 | 5/1996 | Eytcheson | 257/699 |
| 5,550,345 | 8/1996 | Meier et al. | 219/121.63 |
| 5,605,595 | 2/1997 | Betteson | 156/295 |
| 5,660,669 | 8/1997 | Mittleider | 156/273.7 |
| 5,711,838 | 1/1998 | Pankoke | 156/272.8 |
| 5,753,068 | 5/1998 | Mittleider | 156/379.6 |

FOREIGN PATENT DOCUMENTS

WO 93/00212  1/1993 (WO).
WO 94/22661  10/1994 (WO).

* cited by examiner

Primary Examiner—Teresa M. Arroyo
Assistant Examiner—Q. P. Leung
(74) Attorney, Agent, or Firm—Harness, Dickey & Pierce, P.L.C.

(57) ABSTRACT

A laser diode array comprises a plurality of substantially parallel spaced metal plates, each plate having a laser diode mounted upon one side of the plate. The plates are supported electrically insulated from one another on mounting means. The diodes, connected electrically in series, when energized illuminate an oblong workpiece area disposed a certain distance opposite the array. In a preferred embodiment, the mounting means comprises flexible rod means passing through respective apertures of the plates, thus enabling the array to assume a curved configuration, thereby enabling the array to illuminate a straight as well as a curved oblong workpiece area.

11 Claims, 5 Drawing Sheets

LASER DIODE ARRAY

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A MICROFILM APPENDIX

Not Applicable

BACKGROUND OF THE INVENTION

This invention relates to welding, joining or deforming thermoplastic workpieces by laser energy and, more specifically, refers to the construction of a laser diode array for providing uniform and intense laser radiation to a workpiece area for causing fast and uniform heating of the thermoplastic material at such area.

Welding and joining thermoplastic workpieces by laser energy is well known. The area at which workpieces are to be joined is illuminated with a laser beam and the resulting dissipation of energy, if of sufficient magnitude, causes a softening and flowing of thermoplastic material as pressure is applied to the softened material. Upon the cessation of the application of laser energy, the thermoplastic material cools and rigidifies, thus providing a joint.

The laser energy is provided, most suitably, by a laser diode energized from an electrical power supply operating in the continuous-wave mode. For providing a beam larger than that avaiable from a single diode, diode arrays have been developed. A typical commercial product comprises 19 diodes producing 20 W output power. An array of this type is relatively expensive and is limited also to illuminating a substantially straight, oblong shaped, workpiece surface.

SUMMARY OF THE INVENTION

The present invention concerns the construction of a relatively inexpensive array comprising individual laser diodes, the quantity of diodes being selectable to suit a particular application. Furthermore, the array can assume a shape for illuminating both a straight or a curved workpiece area. As a result of these and other features, the array per the present invention provides a high degree of flexibility and versatility when used for welding or joining workpieces of different shapes.

The laser array comprises a plurality of laser diodes, each mounted upon one side of a metal plate, acting as a cooling fin, and the plurality of plates arranged on mounting means which support the plates in spaced juxtaposed position, thus forming the array. The mounting means, in one embodiment, comprise flexible electrically non-conductive rods penetrating the plates. The rods, when bent, cause the array to assume a conforming configuration, thereby enabling the array to not only illuminate a straight oblong surface area of a workpiece, but also a curved area, such as a rounded corner. The diodes are electrically coupled in series for assuring that each diode provides substantially the same amount of laser power when illuminating a workpiece. Due to the quantity of diodes being selectable, the illuminated area is commensurate with the quantity of diodes forming the array. Also, a defective diode is readily replaced, thereby obviating the need to replace the entire array.

One of the principal objects of this invention, therefore, is the provision of a new and improved one-dimensional laser diode array suitable for heating and melting thermoplastic material.

Another important object of this invention is the provision of a new and improved laser diode array which is relatively inexpensive to manufacture and wherein the quantity of diodes is selectable to suit a particular application.

A further important object of this invention is the provision of a laser diode array capable of illuminating and heating a straight or a curved workpiece area.

Other and still further important objects of this invention will be more clearly apparent from the following description when read in conjunction with the accompanying drawings.

DETAILED DESCRIPTION OF THE INVENTION

Figure 1:
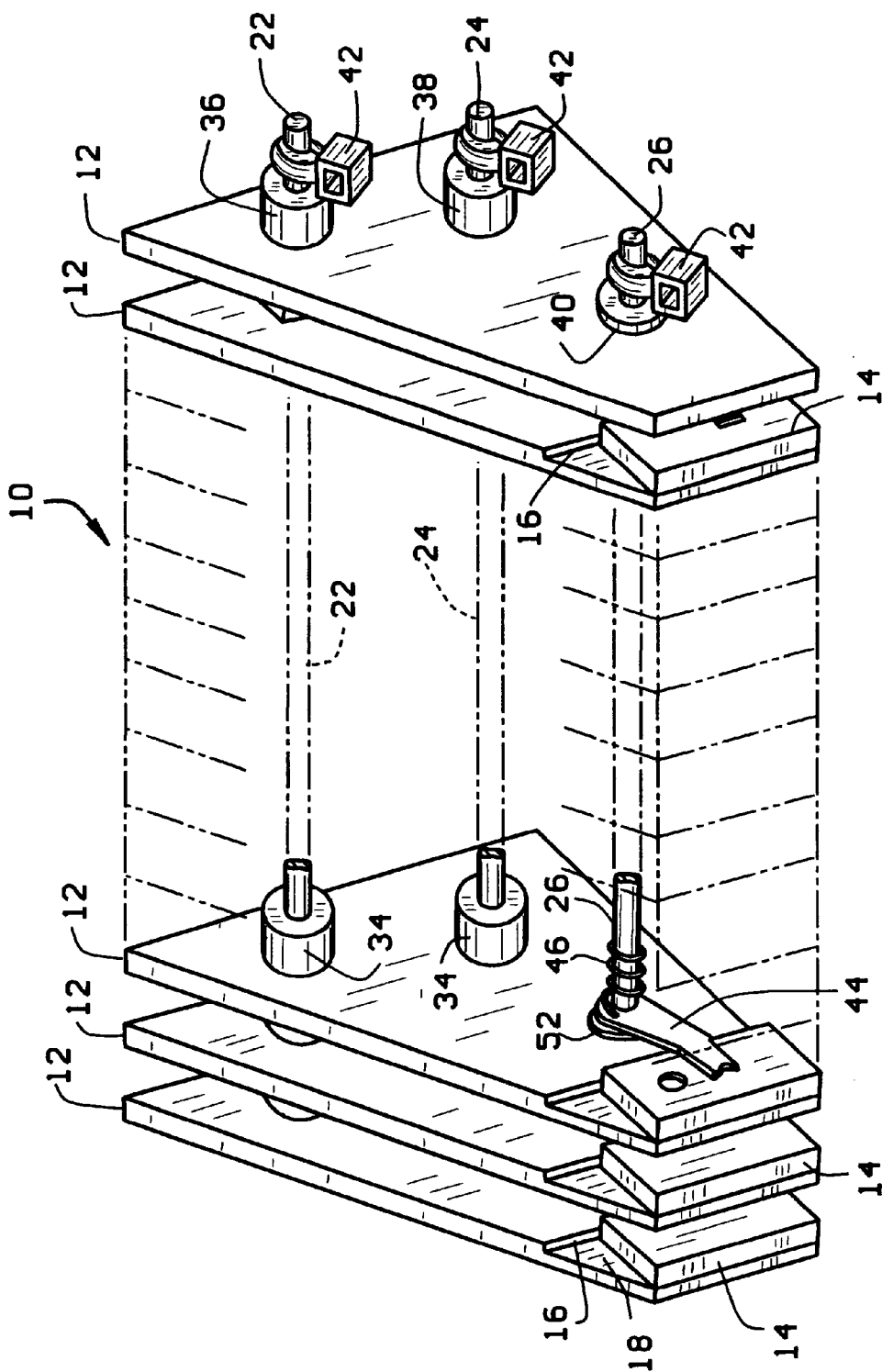
FIG. 1 is a perspective view of the laser diode array forming the present invention.
Figure 2:
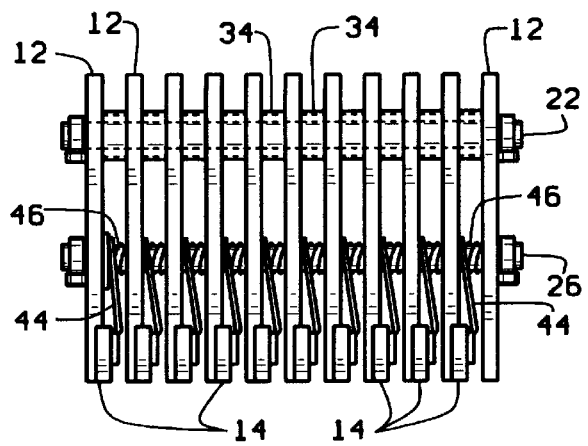
FIG. 2 is a top plan view of the array shown in FIG. 1.
Figure 3:
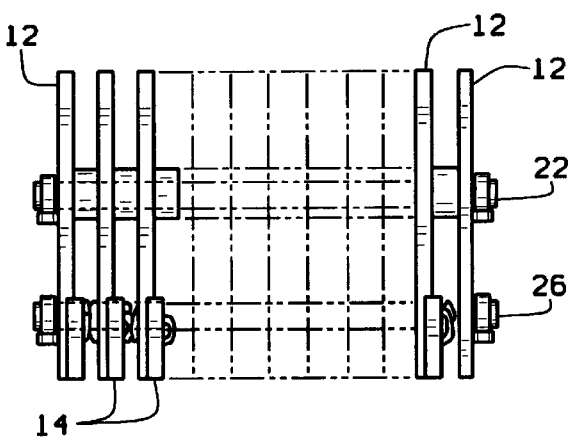
FIG. 3 is a front elevational view of the array.
Figure 4:
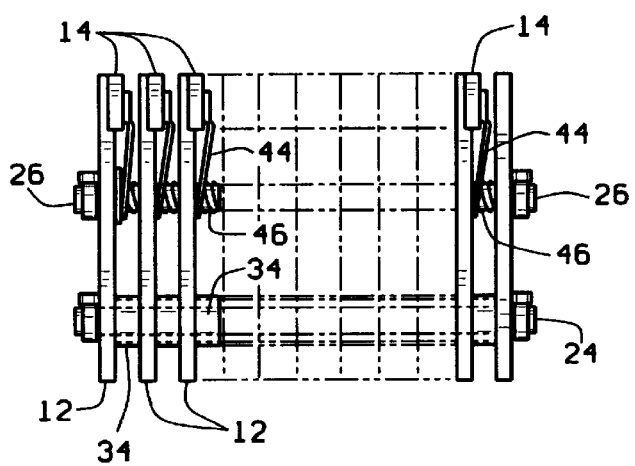
FIG. 4 is a bottom plan view of the array.
Figure 5:
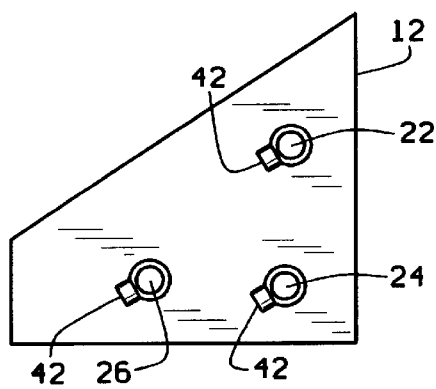
FIG. 5 is an end view of the array.
Figure 6:
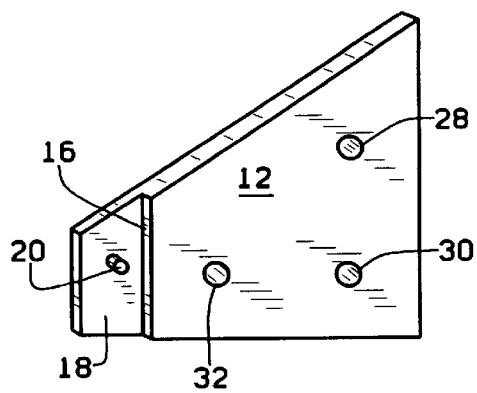
FIG. 6 is a perspective side view of a mounting plate for a laser diode.
Figure 7:
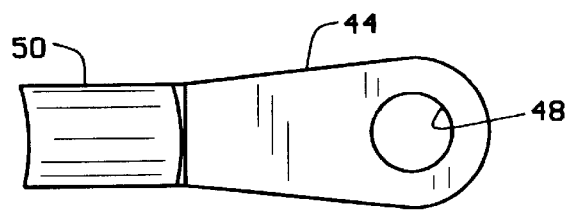
FIG. 7 is a plan view of a metal tab.
Figure 8:
FIG. 8 is a side view of the metal tab shown in FIG. 7.
Figure 9:
FIG. 9 is an end view of the metal tab.
Figure 10:
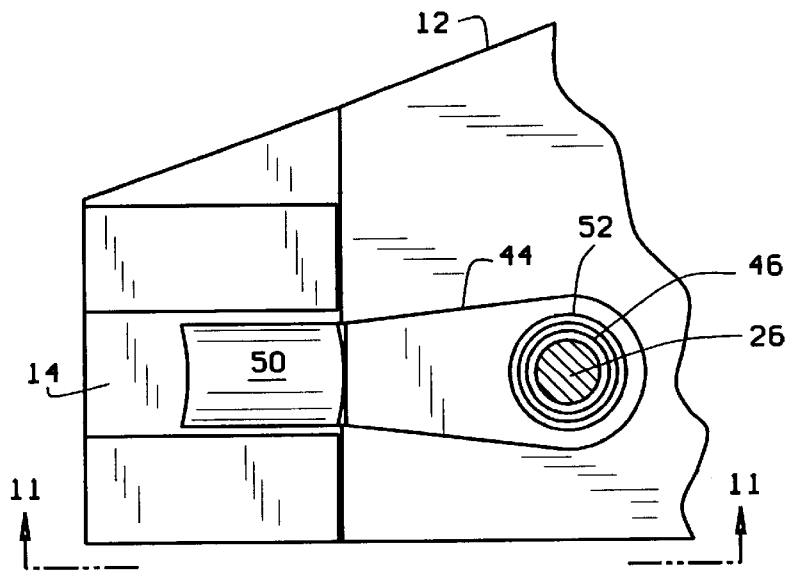
FIG. 10 is a plan view of the metal plate with laser diode mounted thereupon, and metal tab and spring.

Referring now to the figures and FIGS. 1 through 7 in particular, there is shown, denoted by numeral 10, a one-dimensional laser diode array forming the present invention. The array comprises a plurality of substantially identical, parallel disposed and spaced, two-sided, flat metal plates 12, most suitably made of copper or aluminum for serving as cooling fins. Each plate 12 has mounted upon one side of its side surfaces a respective laser diode 14 which for precise and uniform positioning purposes on the plate 12 is disposed against an edge 16 of a flat and recessed surface 18, see also FIGS. 6 and 11. Furthermore, each diode 14 slidingly fits over a pin 20 which extends outwardly from the recessed surface 18. For assuring good electrical contact between the diode 14 and the plate 12 upon which the diode is mounted, a thin film of electrically conductive paste material 15 may be disposed between the rear surface of the diode, herein termed cathode, and the metal plate. Therefore, a respective plate assumes the electrical cathode potential of the diode 14 which is mounted on such plate 12.

Mounting means in the form of a set of three rods 22, 24 and 26 support the plates as an array. The rods have a sliding fit with the respective plate apertures 28, 30 and 32 through which a respective rod passes. The rods, in the embodiment shown, are are insulated electric wire, thereby causing each plate to be electrically insulated from another plate of the array.

The plates 12 are spaced from one another by spacing means, such as electrically insulating spacing washers 34, supported on the rods 22 and 24. The rods pass through the centrally disposed hole in the washer.

The plates 12 disposed on the rods are retained and prevented from undesired lateral motion along the rods by fastening means engaging both ends of a respective rod, such as the washers 36, 38 and 40, and a wire wrap clamp 42, see FIG. 1. It is apparent that other means may be used for retaining the plates, spacing washers and other components in a substantially fixed position on the rods.

As stated above, of the two electrodes of a laser diode, the cathode electrode is electrically connected to the plate 12 upon which such diode is mounted. The anode electrode of the diode is electrically connected to the respective other side of a juxtaposed plate by a set of electrical contact means comprising a metal tab 44 and a metallic helical compression spring 46, thereby providing a series electrical circuit between the diodes of two juxtaposed plates and all diodes of the array.

With particular reference to FIGS. 7 through 11, each metal tab 44 has an aperture 48 for sliding over the support rod 26. The slightly curved front portion 50 of each tab 44 engages the anode of the diode 14, making electrical contact therewith. A thin film of electrically conductive material may be provided. The tab 44 is electrically insulated from the cathode potential of the plate 12 upon which the diode is mounted by an insulating washer 52. An alternative embodiment comprises a piece of insulating tape adhering to the plate. The helical spring 46, also mounted upon the electrically insulated rod 26, provides electrical contact between the tab 44 (anode potential) and the respective other side of a juxtaposed plate 12 (cathode potential of the next succeeding laser diode) as clearly shown in FIG. 11. The spring, besides providing electrical connection, also urges the tab 44 against the anode electrode of the diode 14.

Figure 11:
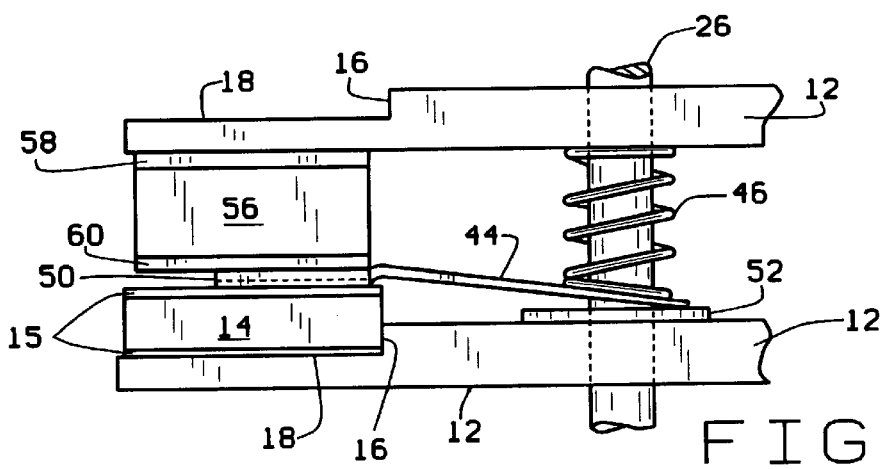
FIG. 11 is a view along lines 11—11 in FIG. 10.

For providing additional assurance of good electrical contact between the tab 44 and the anode of the diode and for holding the tab in place, there is disposed between the non-contact side of the tab 44 and the facing juxtaposed plate 12, a foam rubber pad 56 having an adhesive coating 58 and 60 on its sides, see FIG. 11. The pad 56, when normally slightly compressed, retains the tab 44 in place and prevents rotation of the tab on the support rod.

Figure 12:
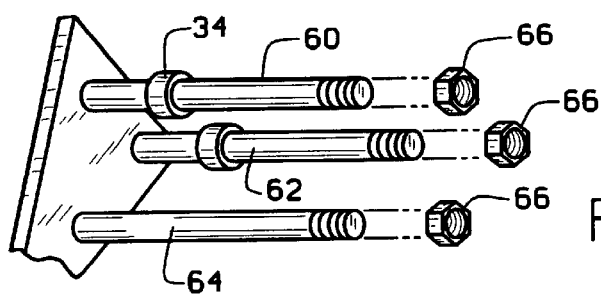
FIG. 12 is a perspective view showing an alternative embodiment of the mounting means.

FIG. 12 shows an alternative mounting means for supporting the plates. Instead of insulated electrical wires 22, 24 and 26, it is possible to use a set of plastic rods 60, 62 and 64, which are threaded at their ends for receiving threaded nuts 66. Of course, a combination of insulated electric wires and electrically non-conductive plastic rods is possible also.

Figure 13:
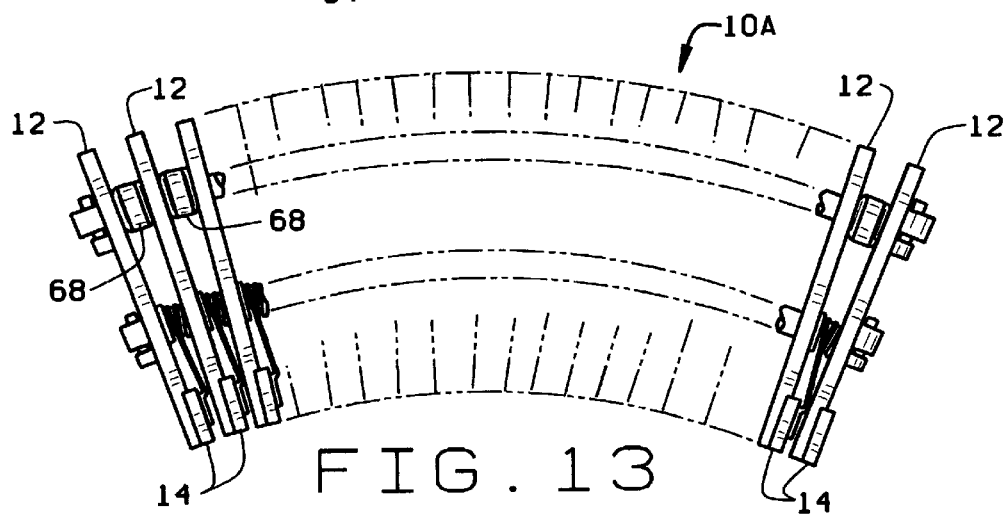
FIG. 13 is a view showing a curved laser diode array.
Figure 21:
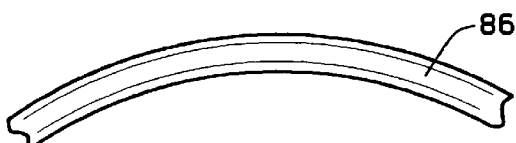
FIG. 21 is a schematic illustration of a curved illuminated workpiece area.

If the support rods are sufficiently flexible, the array can be made to assume a curved configuration 10A, as seen in FIG. 13, for illuminating a likewise curved workpiece area. Since FIG. 13 is a top plan view, the diodes would illuminate a curved workpiece area 86 illustrated in FIG. 21. In a typical example, this curvature may be representative of a rounded corner. Likewise, it will be possible to have the array assume an arched configuration for illuminating evenly a convex or a concave workpiece surface.

Figure 14:
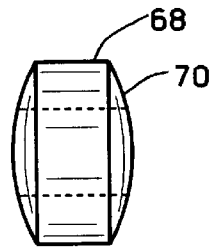
FIG. 14 is an elevational view of an alternative spacing washer.
Figure 15:
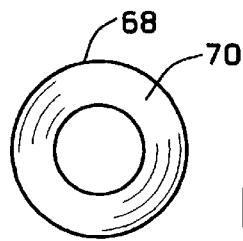
FIG. 15 is a plan view of the washer shown in FIG. 14.
Figure 16:
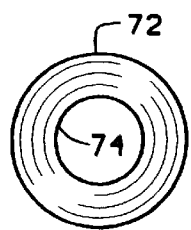
FIG. 16 is an end view of a further alternative spacing washer.
Figure 17:
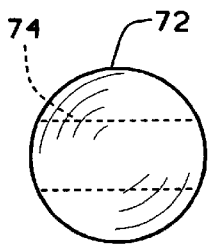
FIG. 17 is a side view of the washer per FIG. 16.

In order to facilitate the provision of a curved or arched array, the support rods must be flexible. For instance, insulated multi-conductor copper wire, 3 mm outside diameter (No. 14 AWG), was found to meet this condition. Moreover, flexing of the array can be improved by a suitable shape of the spacing washers disposed between the individual plates. Instead of flat sided spacing washers 34 seen in FIGS. 1 and 2, it is possible to use convex sided washers 68 shown in FIGS. 14 and 15. The washers are molded with convex-shaped side surfaces 70. The use of such washers 68 is shown in FIG. 13. A further alternative embodiment comprises the use of spherical washers 70, FIGS. 16 and 17, made from electrically non-conductive elastic material, e.g. rubber, and providing each washer with a hole 74 through its center for passing the respective support rod therethrough.

It will be apparent that the locking means engaging the support rods for retaining the plates 12, the spacing washers and the electrical contact means 44 and 46 in place, must be adjusted so as to provide a substantially firm array 10 without exhibiting undesirable motion between the components, yet provide a sufficient degree of flexibility for enabling the array to assume a curved shape. It is possible to loosen the locking means, particularly when plastic nuts 66 are used in combination with threaded plastic rods 60, 62 and 64, for curving the array, and then tighten the array once again for clamping the components of the array in the curved position.

Figure 18:
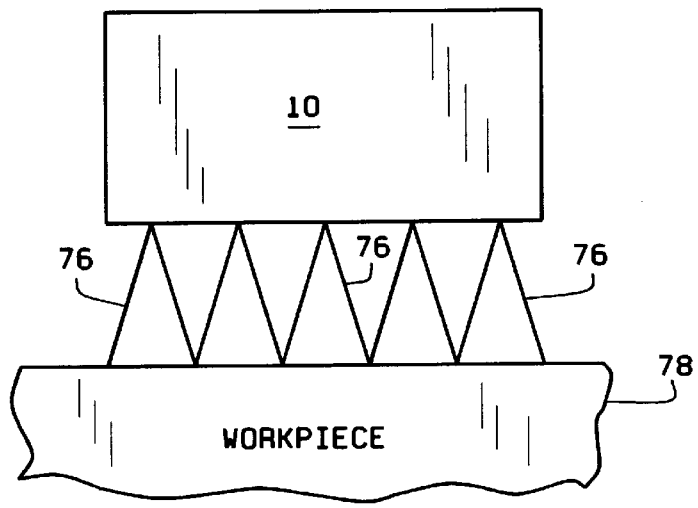
FIG. 18 is an explanatory drawing showing the laser beam pattern emerging from the diode array.
Figure 19:
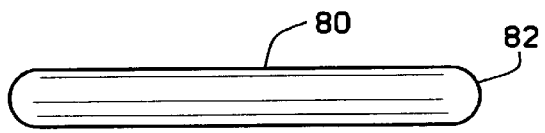
FIG. 19 is a view of the oblong illuminated area of a workpiece.

FIG. 18 illustrates the array 10 and the merging of the laser beams 76 from the diodes to form a substantially continuous beam at the surface of a workpiece 78, which is disposed a certain distance opposite the array. If the laser diodes are provided without the usual focusing lens means, in a typical example, the beam divergence is approximately 45° in one direction and 10° in the other direction, thereby providing an oblong illuminated workpiece area caused by the oblong beam which exhibits rounded corners as seen in FIG. 19. If the workpiece 78 is disposed closer to the array 10, a discontinuous beam results. If the distance between the array and workpiece is greater than that shown in FIG. 18, an overlap of the individual beams 76 will occur and such overlap is desired as the strength of illumination from the diode increases toward its center. Experiments have shown that an overlap of fifty percent provides a substantially uniform illumination. Assuming that the diode spacing is 3 to 4 mm, the diodes-to-workpiece distance should be in the order of 7 mm or greater. Of course, the laser power received by the workpiece decreases with increasing distance from the array.

Figure 20:
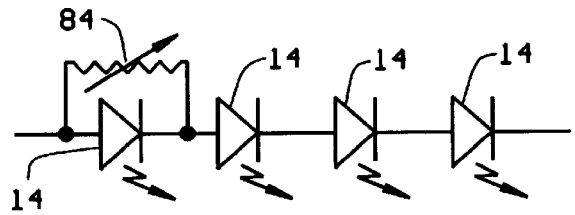
FIG. 20 is a schematic electical circuit diagram.

The diodes, as seen in FIG. 20 and described above, are coupled electrically in series. In a typical embodiment, each diode is rated 1.5 to 2.0 W laser output. As a result of the series connection, each diode provides substantially the same laser output. The diodes are energized using a commercial constant current power supply providing 2 A and operating in the continuous-wave (CW) mode. The supply is coupled to the respective end plates of the array. If desired one or more diodes can be adjusted for reduced output by an adjustable resistor 84 connected across such diode.

If one laser diode fails, the array is easily opened, the failed diode removed and a new diode installed in place.

This feature constitutes a significant advantage over the sealed and welded arrays.

Another important object of this invention resides in the fact that the quantity of laser diodes is selectable to suit a particular workpiece. Plates 12 with diodes 14 can readily be added or subtracted for providing arrays of various lengths. This feature adds to the usefulness of the present array construction.

In a further embodiment, the support rods may comprise metal wire covered by an insulating sleeve.

Improved cooling of the array may be achieved by blowing cooling air through the space between the plates, thereby achieving increased heat transfer between the plates and ambient.

While there have been described and illustrated certain preferred embodiments of the invention and several variations and modifications have been indicated, it will be apparent to those skilled in the art that still further changes may be made without departing from the broad principle of this invention, which shall be limited only by the scope of the appended claims.

I claim:

1. A laser diode array comprising:
   a plurality of two-sided metal plates;
   a plurality of flexible, elongate electrically insulative members supporting said plates in substantially parallel and spaced relation and electrically insulated from one another, thereby causing said plates to form an array;
   each metal plate having mounted on one side thereof a laser diode in position for causing the diodes, when energized, to illuminate an area of a workpiece disposed a certain distance opposite said array;
   said diodes being connected electrically in series, and
   means for coacting with said elongate members for causing said plates to be held in place by said elongate members such that upon flexing of said elongate members said array forms a curved configuration.

2. A laser diode array for illuminating an oblong area of a workpiece comprising:
   a set of flexible support rods spaced from one another with said support rods being flexible for enabling said array to assume a curved configuration;
   a plurality of two-sided metal plates having respective apertures for slidingly fitting over said rods for being supported on said rods in spaced relation and electrically insulated from one another, thereby forming an array of juxtaposed spaced plates;
   electrical insulating spacers disposed between each set of juxtaposed plates for establishing the spacing between said plates;
   a plurality of laser diodes, one diode mounted on a respective first side of each of said plates forming said array and positioned for causing said plurality of laser diodes, when energized, to illuminate an oblong area of a workpiece disposed a certain distance opposite said array, and a respective one of the two electrodes of each diode being in electrical contact with the respective first side of the metal plate upon which the diode is mounted;
   a plurality of electrical contacts, each such contact being disposed for providing electrical contact between the other electrode of a respective diode and the second side of a respective facing juxtaposed metal plate, thereby causing said diodes of the array to be coupled electrically in series with one another, and
   fasteners engaging said rods for causing said plates and said spacing means to be retained in forced contact for providing a mechanically firm array and assuring said electrical contact provided by said electrical contacts.

3. A laser diode array as set forth in claim 2, said spacing means comprising convex sided electrical insulating washers mounted upon at least one of the rods.

4. A laser diode array as set forth in claim 2, said spacing means comprising washers made from electrically non-conductive elastic material mounted upon at least one of the rods.

5. A laser diode array as set forth in claim 2, said metal plates being made of copper or aluminum.

6. A laser diode array as set forth in claim 2, said respective first side of each plate including means for mounting a laser diode in predetermined position upon such side.

7. A laser diode array as set forth in claim 2, each of said electrical contact means comprising the combination of a metal spring and a metal tab, both supported on one of the rods; said tab contacting said other electrode of a respective diode and said metal spring being in electrical contact with said tab and said second side of the respective facing juxtaposed metal plate, and the force exerted by said spring urging said tab against said other electrode and causing said diode to be in contact with the respective first side of the plate upon which such diode is mounted.

8. A laser diode array as set forth in claim 7, and means disposed between said tab and the second side of the juxtaposed plate for retaining said tab in engaged position and electrical contact with said other electrode.

9. A laser diode array as set forth in claim 7, said metal spring comprising a helical compression spring.

10. A laser diode array as set forth in claim 2, and electrical circuit means coupled to a selected laser diode for adjusting the laser output provided by such diode.

11. A laser diode array for illuminating an oblong area of a workpiece comprising:
   a set of parallel spaced flexible support rods having an electrically non-conductive surface;
   a plurality of two-sided flat substantially identical metal plates having a respective set of apertures for slidingly fitting over said rods and for being supported on said rods in spaced relation and electrically insulated from one another, thereby forming an array of juxtaposed spaced plates;
   electrical insulating spacing means disposed on at least one of the rods of said set and interposed in the space between each pair of juxtaposed plates for establishing the spacing between said juxtaposed plates;
   a plurality of laser diodes, each having an anode and a cathode;
   each of said plates forming said array having one of said diodes removably mounted upon its respective first side and causing the cathode of such diode to be in electrical contact with the metal plate upon which such diode is mounted;
   a recessed area and a pin extending therefrom coacting between a diode and the respective plate for causing said diodes to be mounted uniformly upon said plates for causing said diodes, when energized, to illuminate an oblong area of a workpiece disposed a certain distance opposite said array;

a plurality of electrical contact means supported by another one of said set of rods, each said contact means comprising the combination of a metal spring and a metal tab, said tab and said spring disposed for causing an electrical connection between the anode of a respective diode mounted on one of said plates and the cathode of a diode mounted upon a facing juxtaposed plate by providing electrical contact with the respective second side of said juxtaposed plate, and said spring acting upon said tab for urging said tab in contact with said anode, thereby causing the diodes of the array to be coupled electrically in series with one another, and means engaging said rods for causing said plates and said spacing means to be urged into contact with one another for providing a substantially firm yet bendable array, capable of assuming a curved configuration for illuminating a curved oblong workpiece area.

* * * * *